United States Patent
Gervais

(10) Patent No.: US 8,922,400 B2
(45) Date of Patent: Dec. 30, 2014

(54) METHOD FOR COMPRESSING DIGITAL VALUES OF IMAGE, AUDIO AND/OR VIDEO FILES

(75) Inventor: Than Marc-Eric Gervais, Paris (FR)

(73) Assignee: I-CES (Innovative Compression Engineering Solutions), Paris (FR)

( * ) Notice: Subject to any disclaimer, the term of this patent is extended or adjusted under 35 U.S.C. 154(b) by 0 days.

(21) Appl. No.: 13/883,138

(22) PCT Filed: Nov. 2, 2010

(86) PCT No.: PCT/EP2010/066611
§ 371 (c)(1),
(2), (4) Date: Jul. 23, 2013

(87) PCT Pub. No.: WO2012/059124
PCT Pub. Date: May 10, 2012

(65) Prior Publication Data
US 2013/0293400 A1    Nov. 7, 2013

(51) Int. Cl.
*H03M 7/30* (2006.01)
*H04N 19/90* (2014.01)

(52) U.S. Cl.
CPC ........... *H03M 7/30* (2013.01); *H04N 19/00945* (2013.01)
USPC ............. 341/76; 375/144; 375/244; 375/243; 375/245; 375/240.01; 710/34; 710/37; 710/68; 345/601; 345/604; 345/605; 382/236; 382/238; 382/239; 382/244; 382/245

(58) Field of Classification Search
CPC ........... H03M 7/30; H03M 7/34; H03M 7/46; H03M 7/3084; H03M 7/3086; H03M 7/3088; H03M 3/022; H03M 3/042; H03M 3/40; H03M 3/04; H03M 19/00157; H03M 19/00024; H03M 19/00763; H03M 19/00278; H03M 19/00569; H03M 19/0009; H03M 19/00533; H03M 19/00387; H03M 19/00484; H03M 19/00945; H03M 19/00066; H03M 19/000139; H03M 19/0006; H04N 7/34; H04N 9/64; H04N 11/046; H04N 69/04; H04N 69/40; H04L 69/04; H04L 69/40; H04B 14/06; H04B 14/048; H04B 12/04; G11B 20/10; G11B 5/09
USPC ......... 341/51–90; 710/7, 34, 37, 68; 382/236, 382/238, 239, 244, 245; 345/601, 604, 605; 375/240.01, 240.24, 240.29, E7.193, 375/E7.133, E7.161, E7.144, 244, 243, 245
See application file for complete search history.

(56) References Cited

U.S. PATENT DOCUMENTS 4,713,828 A * 12/1987 Mehrgardt .................... 375/249
5,363,098 A * 11/1994 Antoshenkov .................. 341/95

(Continued)

*Primary Examiner* — Lam T Mai
(74) *Attorney, Agent, or Firm* — Young & Thompson

(57) ABSTRACT

A method is disclosed for compressing a sequence of initial digital values into a compressed sequence of compressed values, intending to restore these values into a decompressed sequence of decompressed values. For a first initial value of the sequence, the compressed value of the first initial value is equal to the first initial value and the decompressed value of the compressed value of the first initial value is equal to the first initial value. For each current initial value, the method includes calculating the difference between the current initial value and the decompressed value of the initial value immediately preceding the current value, calculating a compressed value of the difference using a complementary compression function, calculating the decompressed value corresponding to said current initial value, applying the three preceding steps to the immediately following value if there is one, and constituting the compressed sequence of the compressed values, each corresponding to a respective initial value.

9 Claims, 1 Drawing Sheet

(56) References Cited

U.S. PATENT DOCUMENTS

Figure 1:
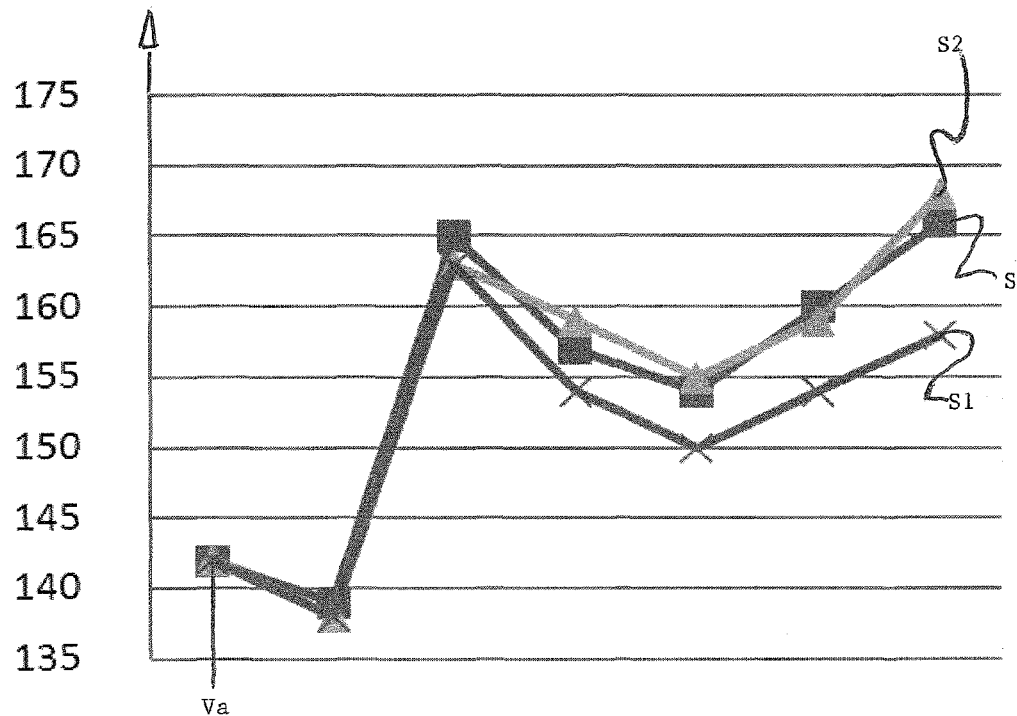

| | | | | |
|---|---|---|---|---|
| 5,617,506 | A * | 4/1997 | Burk et al. | 704/201 |
| 6,374,250 | B2 * | 4/2002 | Ajtai et al. | 1/1 |
| 6,396,420 | B1 * | 5/2002 | Augustine | 341/50 |
| 6,804,733 | B1 * | 10/2004 | Michel et al. | 710/68 |
| 7,012,618 | B2 * | 3/2006 | Pau et al. | 345/604 |
| 7,079,051 | B2 * | 7/2006 | Storer et al. | 341/51 |
| 7,098,816 | B2 * | 8/2006 | Ng et al. | 341/57 |
| 7,280,057 | B2 * | 10/2007 | Delfs et al. | 341/87 |
| 7,454,431 | B2 * | 11/2008 | Vo et al. | 341/76 |
| 7,689,051 | B2 * | 3/2010 | Mukerjee | 382/244 |
| 8,427,346 | B2 * | 4/2013 | Potkonjak | 341/50 |
| 8,429,139 | B2 * | 4/2013 | Gervais | 707/693 |
| 8,572,218 | B2 * | 10/2013 | Narayanan et al. | 709/220 |

* cited by examiner

METHOD FOR COMPRESSING DIGITAL VALUES OF IMAGE, AUDIO AND/OR VIDEO FILES

The present invention relates to the field of compressing digital values of a digital image, audio and/or video file, particularly of a file comprising a sequence of values.

The main constraints of compression methods are on one hand to reduce as much as possible the volume, measured in octets, of an initial digital file, by compressing it, and on the other hand, to restore a file that is as close as possible to the initial file.

Certain compression methods make it possible to restore the initial values exactly. This is the case for Differential Pulse-Code Modulation (DPCM). According to this method, an original value, i.e. the first value of the initial digital file, is kept, then each other value is replaced by its difference with the value that precedes it in the initial file. The numbers corresponding to the differences are generally smaller than those corresponding to the initial values, which makes it possible to obtain a compressed file. To restore an initial value, one need only add the corresponding difference back to the preceding initial value, i.e. one adds the successive value differences together with the original value.

It is allowed that reducing the gaps between two initial values as much as possible makes it possible to obtain the most significant possible compression ratio. This is how DPCM modulation was introduced. However, the compression rate obtained using the DPCM method remains low. The idea of applying an additional compression to the file of the differences therefore seems appealing. However, the errors caused by this new compression accumulate as, during the restoration, one adds the successive differences together with the original value. According to the ADPCM (Adaptive DPCM) method, one partially offsets these errors by using an algorithm intended to predict them. This method remains unsatisfactory in light of the compression rates one wishes to achieve.

On the contrary, the invention aims to propose a simple and powerful compression method that makes it possible to combine the advantages of a more significant compression rate with that of the DPCM method alone, while keeping the advantages of differential coding, without error propagation.

A method according to the invention to compress a digital file, i.e. a file comprising a sequence of initial digital values, is characterized in that, for an initial value first in the sequence, the compressed value of that first initial value is equal to the original initial value then in that, for each current initial value, successively, the following steps are carried out:
   one calculates the difference between the current initial value and the decompressed value of the initial value immediately preceding the current value; then,
   one calculates a compressed value of said difference using compression function; then,
   one calculates the decompressed value corresponding to said current initial value; then,
   in that one applies the three preceding steps to the immediately following value if there is one; and,
   one constitutes a compressed sequence of compressed values, each corresponding to a respective initial value.

Thus, there is no error propagation.

Advantageously, one keeps, on the compressed value, the sign of the difference. Preferably, the compressed value is rounded to the nearest whole number.

The complementary compression function can be an $n^{th}$ root function, n>1, for example the "square root" function or the "cubic root" function.

The complementary compression function can also be a division by a constant C, with C>1.

According to the invention, a decompression method for a sequence of digital values compressed using one of the methods according to the invention is characterized in that for a first compressed value of the compressed sequence, the corresponding decompressed value is equal to the first compressed value then in that, for each current compressed value, successively, one performs the following steps:
   one calculates the corresponding decompressed value by applying, to the current compressed value, an inverse function of the complementary compression function and then adds the preceding decompressed value; then,
   in that one applies the preceding step to the immediately following compressed value if there is one; and,
   one constitutes a decompressed sequence of decompressed values, each corresponding to a respective initial value.

Advantageously, the inverse function keeps the sign of the compressed value.

Figure 2:
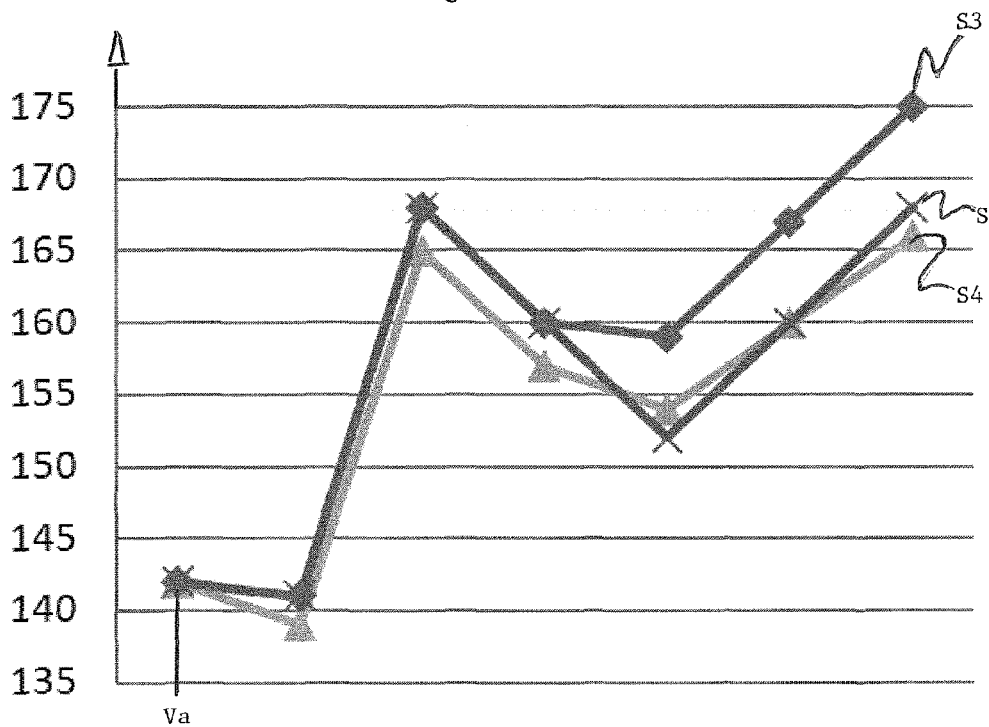

Several embodiments of the invention will be described below, as non-limiting examples, in reference to the appended drawings in which:

FIG. 1 is a graph illustrating the restoration of digital values of an image file, the compressed values corresponding to the whole part of the square root of the differences calculated with the DPCM method and with the method according to the invention; and, FIG. 2 is a graph illustrating the restoration of digital values of an image file, the compressed values corresponding to the whole part of the cubic root of the differences calculated with the DPCM method and with the method according to the invention.

According to the invention, the compression method can be expressed by the following general formulas:
   given an initial sequence S of first values Va, . . . , Vp, Vq, . . . , Vz.
      the compressed value VCa of the first value Va of the sequence S is such that: VCa=Va; the restored value VDa of the compressed value VCa is such that: VDa=VCa=Va and,
      for a current value Vq different from Va, the sequence S is such that:
         given a decompressed value VDp corresponding to a value Vp preceding the current value Vq in the sequence S
         the compressed value VCq of the current value Vq is:

$VCq = +|\text{rounded}[f(Dq)]|$, if $Dq>0$, and $VCq = -|\text{rounded}[f(Dq)]|$, if $Dq<0$ with: $Dq = Vq - VDp$ the decompressed value VDq, corresponding to the current value Vq is:

$VDq = +|\text{rounded}[f^{-1}(VCq)]| + VDp$, if $VCq>0$, and $VDq = -|\text{rounded}[f^{-1}(VCq)]| + VDp$, if $VCq<0$ the rounding being done to the nearest whole number, and
         where f is a complementary compression function.

In the above formulas, "z" does not represent a $26^{th}$ value, but the last value of the sequence, regardless of the number of values that sequence includes.

The complementary compression function f and its inverse $f^{-1}$ can be defined over a range of initial values, or of |Vq-VDp| differences sufficient to allow sufficient processing of the initial values. For example, if the compression function f is a logarithm, it can only be applied to differences greater than 1, the compressed value of the other differences being considered null. If the function f is a base "x" logarithm, it can also be applied to the "differences plus 1," for example $f(Vq) = \log_x(1+|Vq-VDp|)$.

Table T1 below comprises:
in its first column, the values at the beginning of a digital image file, called initial values;
in the second column, the values reduced using the DPCM method, corresponding to the initial values;
in the third column, the corresponding compressed values;
in the fourth column, the decompressed difference values;
in the fifth column, the decompressed values, with the DPCM method, corresponding to the initial values; and,
in the sixth column, the deviations observed between the initial values Vi and the decompressed values VD obtained using the DPCM method.

The complementary compression function f used in this example to obtain the values of the third column is the "square root" function of the absolute value of the difference D, or:

$$VC = f(D) = \sqrt{|D|}$$

TABLE T1

| Vi | D | VC = f(D) | f⁻¹ (VC) | VD | E |
|---|---|---|---|---|---|
| 142 |    | 142 |    | 142 |    |
| 139 | −3 | −2 | −4 | 138 | −1 |
| 165 | 26 | 5  | 25 | 163 | −2 |
| 157 | −8 | −3 | −9 | 154 | −3 |
| 154 | −3 | −2 | −4 | 150 | −4 |
| 160 | 6  | 2  | 4  | 154 | −6 |
| 166 | 6  | 2  | 4  | 158 | −8 |

In table T1, there are seven initial values Vi of the sequence S, including the first value Va=142.

One notes that, in the DPCM method illustrated in table 1, the error E between the restored values VD and the initial values Vi increases, in absolute value, until it reaches 8, i.e. 8/166 #5% error. It is obvious that for an actual file comprising a sequence S of more than seven values, the error E may reach much higher figures.

Table T2 below comprises:
in its first column, the same values of the beginning of the digital image file as those of column 1 of table 1;
in the second column, difference values, corresponding to the initial values reduced using the method according to the invention;
in the third column, the compressed difference values;
in the fourth column, the decompressed difference values; and,
in the fifth column, the values completely decompressed using the method according to the invention, corresponding to the initial values; and,
in the sixth column, the deviations observed between the initial values Vi and the decompressed values VD obtained using the method according to the invention.

The complementary compression function f used in this example to obtain the values of the third column is the same as that used in the case of table T1, i.e. the "square root" function.

TABLE T2

| Vi | D | VC = f(D) | f⁻¹ (VC) | VD | E |
|---|---|---|---|---|---|
| 142 |    | 142 |    | 142 |    |
| 139 | −3 | −2 | −4 | 138 | −1 |

TABLE T2-continued

| Vi | D | VC = f(D) | f⁻¹ (VC) | VD | E |
|---|---|---|---|---|---|
| 165 | 27 | 5  | 25 | 163 | −2 |
| 157 | −6 | −2 | −4 | 159 | 2  |
| 154 | −5 | −2 | −4 | 155 | 1  |
| 160 | 5  | 2  | 4  | 159 | −1 |
| 166 | 7  | 3  | 9  | 168 | 2  |

One notes that, in the method according to the invention illustrated in table 2, the error E between the restored values VD and the initial values Vi is stable in absolute value, and does not exceed 2, i.e. 2/166 #1% error. This stability is reproduced, regardless of the number of initial values Vi of the sequence S.

FIG. 1 illustrates, in a same graph, with the same scales, the sequence S of values Vi from the first column of tables 1 and 2, the sequence S1 of corresponding compressed and decompressed values using the DPCM method, constituting the fifth column of table 1, and the sequence S2 of the corresponding compressed and decompressed values using the method according to the invention, constituting the fifth column of table 2.

One notes that the sequence S1 of restored values obtained using the DPCM method tends to diverge from the sequence of initial values. This results from the fact that, during the decompression with the DPCM method, the errors caused by the compression-decompression accumulate with each other, as one moves away from the original value Va going through the sequence S of initial values.

One notes that the sequence S2 of restored values obtained using the method according to the invention is very close to the sequence of initial values and does not diverge from it. This demonstrates the advantage of the method according to the invention.

Tables T3 and T4 are similar to tables T1 and T2, respectively. In the example illustrated in tables T3 and T4, as well as in FIG. 2, the sequence S of initial values is identical to that used for tables T1 and T2, but the complementary compression function f used to obtain the values of the third column is the "cubic root" function.

TABLE T3

| Vi | D | VC = f(D) | f⁻¹ (VC) | VD | E |
|---|---|---|---|---|---|
| 142 |    | 142 |    | 142 |    |
| 139 | −3 | −1 | −1 | 141 | 2  |
| 165 | 26 | 3  | 27 | 168 | 3  |
| 157 | −8 | −2 | −8 | 160 | 3  |
| 154 | −3 | −1 | −1 | 159 | 5  |
| 160 | 6  | 2  | 8  | 167 | 7  |
| 166 | 6  | 2  | 8  | 175 | 9  |

TABLE T4

| Vi | D | VC = f(D) | f⁻¹ (VC) | VD | E |
|---|---|---|---|---|---|
| 142 |    | 142 |    | 142 |    |
| 139 | −3 | −1 | −1 | 141 | 2  |
| 165 | 24 | 3  | 27 | 168 | 3  |
| 157 | −11 | −2 | −8 | 160 | 3  |
| 154 | −6 | −2 | −8 | 152 | −2 |
| 160 | 8  | 2  | 8  | 160 | —  |
| 166 | 6  | 2  | 8  | 168 | 2  |

One notes that, in the DPCM method illustrated in table 3, the error E between the restored values VD and the initial values Vi increased until it reaches 9, i.e. 9/166>5% error. It is obvious that for a real file comprising a sequence S of more than seven values, the error E is likely to reach much higher figures.

One notes that, in the method according to the invention illustrated table 4, the error E between the restored values VD and the initial values Vi is stable, in absolute value, and does not exceed 3, i.e. 2/166<2% error. This stability is reproduced, regardless of the number of initial values Vi of the sequence S.

FIG. 2 illustrates, on a same graph, with the same scales, the sequence S of values Vi of the first column of tables 3 and 4, the sequence S3 of the corresponding compressed and decompressed values using the DPCM method, constituting the fifth column of table 3, and the sequence S4 of the corresponding compressed and decompressed values using the method according to the invention, constituting the fifth column of table 4.

One notes that the sequence S3 of restored values obtained using the DPCM method tends to diverge from the sequence of the initial values, even more strongly than sequence S1. One notes that sequence S4 of restored values obtained using the method according to the invention is very close to the sequence of initial values and does not diverge from it. This further demonstrates the advantage of the method according to the invention.

Of course, the invention is not limited to the examples just described.

Thus, the complementary compression function can be a function of the $n^{th}$ root type, the value n being larger as the predictable differences between the two successive values are larger. The complementary compression function can also be a division by a constant C, in which C can be larger as the predictable differences between the two successive values are larger. Of course, these examples are not limiting.

The invention claimed is:

1. A method for compressing a sequence of initial digital values in a first digital image, audio and/or video file into a compressed sequence of compressed values in a second digital image, audio and/or video file, intending to restore compressed values into a decompressed sequence of decompressed values in a third digital image, audio and/or video file, comprising:
   for a first initial value of the sequence, setting the compressed value of the first initial value equal to said first initial value and setting the decompressed value of said compressed value of the first initial value equal to said first initial value, and,
   for each current initial value, the following steps are carried out, in order:
      calculating a difference between the current initial value and the decompressed value of an initial value immediately preceding the current initial value;
      calculating a compressed value of said difference using a complementary compression function;
      calculating the decompressed value corresponding to said current initial value;
      applying the steps of calculating a difference, calculating a compressed value and calculating a decompressed value, to an immediately following value if there is one; and,
      constituting the compressed sequence of the compressed values, each corresponding to a respective initial value.

2. The method according to claim 1, in which the compressed value is rounded to the nearest whole number.

3. The method according to claim 1, further comprising keeping, in the compressed value, a sign that is the same as a sign of the difference.

4. The method according to claim 1, in which the complementary compression function is an nth root function where n>1.

5. The method according to claim 4, in which the complementary compression function is the "square root" function.

6. The method according to claim 4, in which the complementary compression function is the "cubic root" function.

7. The method according to claim 1, in which the complementary compression function is a division by a constant C, where C>1.

8. A method for decompressing a sequence of digital values compressed using the method according to claim 1, comprising:
   for a first compressed value of the compressed sequence, setting the decompressed value is equal to the first compressed value,
   for each current compressed value performing the following steps in order:
      calculating a corresponding decompressed value by applying, to the current compressed value, an inverse function of the complementary compression function and then adds a preceding decompressed value;
      applying the step of calculating the corresponding decompressed value to an immediately following compressed value if there is one; and,
      constituting a decompressed sequence of decompressed values, each corresponding to a respective initial value.

9. The method to claim 8, wherein the inverse function has a sign that is the same as a sign of the compressed value.

* * * * *